(12) United States Patent
De Vries et al.

(10) Patent No.: US 7,005,844 B2
(45) Date of Patent: *Feb. 28, 2006

(54) MEASURING CIRCUIT ARRANGEMENT FOR ELECTRICITY METERS FOR DIRECT CONNECTION

(75) Inventors: Jacob De Vries, Allenwinden (CH); Adrian Ulrich, Engelberg (CH)

(73) Assignee: Landis & Gyr AG, Zug (CH)

( * ) Notice: Subject to any disclaimer, the term of this patent is extended or adjusted under 35 U.S.C. 154(b) by 0 days.

This patent is subject to a terminal disclaimer.

(21) Appl. No.: 10/470,475

(22) PCT Filed: Jan. 31, 2002

(86) PCT No.: PCT/IB02/00298

§ 371 (c)(1),
(2), (4) Date: Jul. 29, 2003

(87) PCT Pub. No.: WO02/063319

PCT Pub. Date: Aug. 15, 2002

(65) Prior Publication Data

US 2004/0090220 A1  May 13, 2004

(30) Foreign Application Priority Data

Feb. 7, 2001 (DE) ................................. 101 05 782

(51) Int. Cl.
*G01R 11/32* (2006.01)
*G01R 35/04* (2006.01)

(52) U.S. Cl. .............................. 324/103 R; 324/158.1; 324/127; 324/142; 324/74

(58) Field of Classification Search ............ 324/117 R, 324/127, 103 R, 138; 702/61, 64
See application file for complete search history.

(56) References Cited

U.S. PATENT DOCUMENTS

| 5,196,784 | A | * | 3/1993 | Estes, Jr. ................ 324/117 R |
| 5,264,786 | A | * | 11/1993 | Clarke et al. ............... 324/142 |
| 5,453,697 | A | * | 9/1995 | Schweer et al. ............ 324/601 |
| 5,777,835 | A | * | 7/1998 | Innes ......................... 361/93.6 |
| 5,949,231 | A | * | 9/1999 | Lau ............................ 324/127 |
| 6,534,967 | B1 | * | 3/2003 | Weggel ..................... 324/127 |

FOREIGN PATENT DOCUMENTS

EP  0 414 657 A2  *  9/1990

* cited by examiner

*Primary Examiner*—Vinh Nguyen
*Assistant Examiner*—Emily Y Chan
(74) *Attorney, Agent, or Firm*—Maginot Moore & Beck

(57) ABSTRACT

A measuring circuit arrangement (1) for an electricity meter for direct connection is respectively connected, to an input (3) for voltage measurement and an input (4) for current measurement of a measuring chip (2) for each phase of a three phase supply. Upstream of the input (3) for voltage measurement is a voltage divider (R1,R2) provided in order to match the voltage level, and upstream of the input (4) for current measurement is a voltage transformer (5) with measuring shunt ($R_{SH}$) installed according to the invention. The voltage transformer (5) is so arranged that its ohmic resistance towards the measuring shunt ($R_{SH}$) on the one hand sufficiently limits standard direct-current impingement of the voltage transformer (5) and on the other hand this ohmic resistance is also small enough so that, together with the inductance of the current transformer (5), it displays no more than standard angle error.

11 Claims, 1 Drawing Sheet

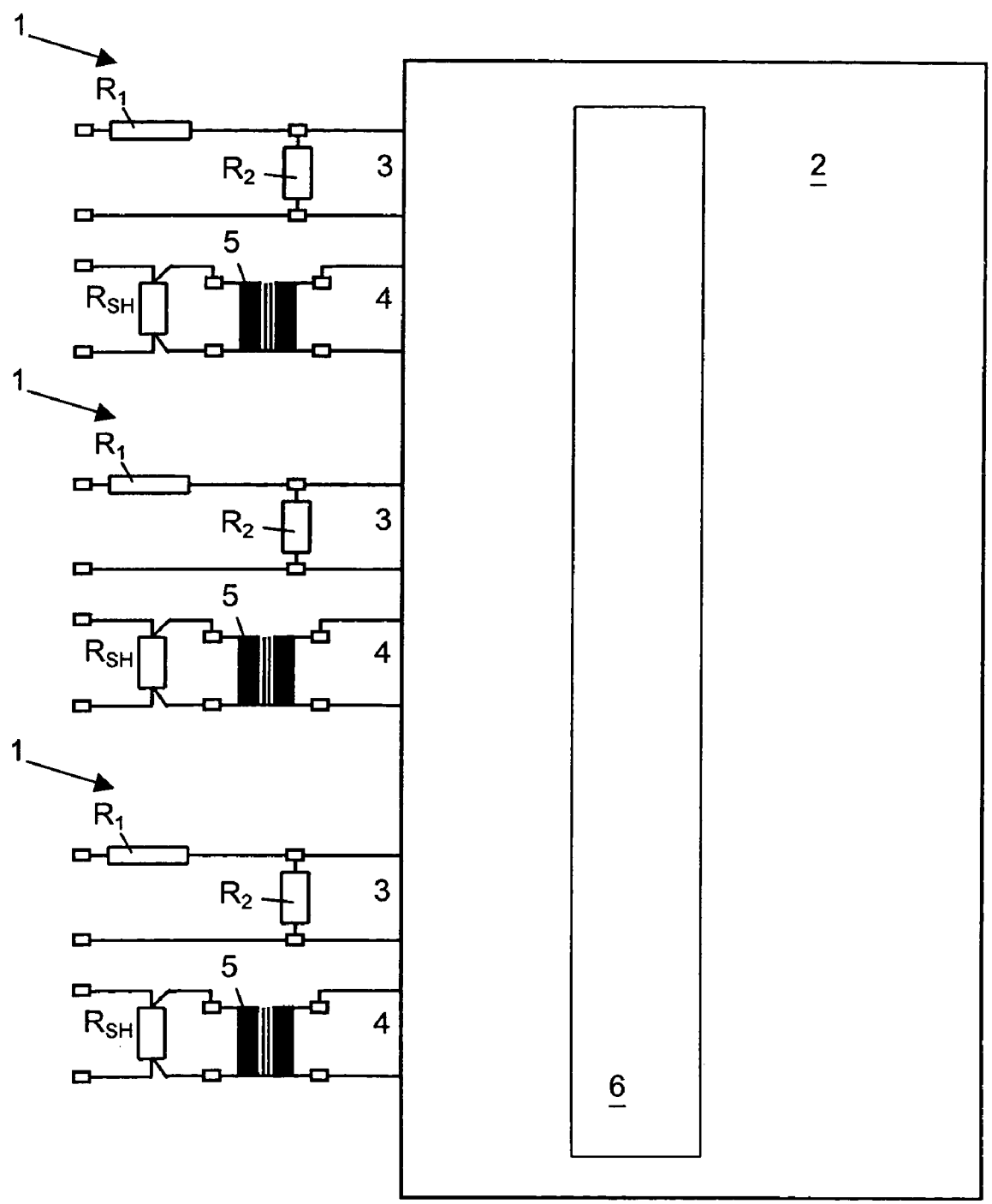

MEASURING CIRCUIT ARRANGEMENT FOR ELECTRICITY METERS FOR DIRECT CONNECTION

This is continuation of PCT/IB02/00298 filed on Jan. 31, 2002.

BACKGROUND

The invention concerns the field of metering technology. It concerns a measuring circuit arrangement for voltage measurement and current measurement for electricity meters for direct connection.

In industrial applications, electronic electricity meters have already largely replaced electromechanical meters due to the advantages that they offer. Connection of these industrial meters as at present known is indirect, that is to say through current transformers or voltage transformers displaying the corresponding standard characteristics. Among the outstanding characteristics of electronic meters, particular mention should be made of the fact that they can be read at a distance, require no maintenance, are compact, highly accurate and capable of handling a wide range of current.

As a consequence of these clear advantages over electromechanical meters, the use of electronic electricity meters is also of growing importance for household metering. A fundamental difference between household meters and the industrial meters mentioned above can be seen in their mode of installation: household meters are typically connected direct, which means that they are connected directly to the conductors supplying the dependent load. Here, current measurement plays a key role, since it provides the galvanic isolation to the meter, and also because strict requirements in accordance with international standard IEC 1036 are imposed on these meters. The requirements relating to accuracy of current measurement in conformity with this standard include a low rate of amplitude error (<1%), a low rate of phase error (<0.30°) and a low rate of linearity error. Furthermore, direct current tolerance of $I_{max}/\pi$ in conformity with the standard in question must be attained; this means that such electronic electricity meters must be able to continue to measure in accordance with the standard even when subjected to mixed current with a proportion of direct current $\leq I_{max}/\pi$. Thus these electronic electricity meters for direct connection must not be brought to saturation even when subjected to a proportion of direct current of $I_{max}/\pi$, but even when subjected to such a direct current magnetic bias, must still be capable of representing the alternating proportion of the load current up to $I_{max}$.

Measuring circuit arrangements that use direct current tolerant current transformers with direct current tolerance up to $\leq I_{max}/\pi$ are known, but these direct current tolerant current transformers are unable to cope with the maximum permissible phase shifts, as phase shifts of up to 5° between current and voltage measurement values can arise in them. This means that direct current tolerant current transformers, which are more expensive than conventional current transformers because of the special materials that have to be selected, have to be complemented with a suitable phase compensation arrangement involving yet further expense.

Correction of phase shift by means of a time delay, as described for instance in DE 196 39 410 A1, can only be of limited help here. As household meters are mass production products, economic considerations take on particular importance in the selection of all components. For this reason, the correction of phase shift installed in conventional meters is only possible within narrow limits by time delay, in addition to which, this correction by means of time delay is not coupled to frequency, so that such correction is in itself frequency-dependent, and therefore limited.

But as long as direct currents in connection with energy charging are not to be measured, but must simply be tolerated, the technology of sensors acting as transformers will continue—especially by reason of their simple, economical and sturdy construction. In this respect, the fact has also been taken into account until now that for a given current density, and due to their design, current transformers are larger, heavier and hence more expensive in comparison to other sensors, such as voltage transformers, for example.

SUMMARY

The invention described here attempts to remedy the problems mentioned above. It is thus the task of the invention to provide a measuring circuit arrangement for the types of electricity meter described above, which even in the event of the impingement of mixed current, will be capable of tolerating the limit values laid down in the standard without suffering damage, and at the same time of measuring correctly at all grid frequencies habitually encountered in operation within the standard prescriptions regarding real power and apparent power. The task of the invention also consists in ensuring that this measuring circuit arrangement is robust and furthermore, for purposes of mass application, is simple and capable of being produced at economic cost.

The essential of the invention consists in the fact that for electricity meters for direct connection, a measuring shunt connected in series upstream of a voltage transformer transforms the current to be measured into a voltage, the voltage transformer being both ready to galvanically isolate the downstream measuring chip, and also capable of tolerating a direct current load with the limits laid down by the standards without exceeding standard limits for angle error between current and voltage. It must be emphasized that the voltage transformer is matched in such a way that its ohmic resistance is simultaneously large enough not to be saturated by a maximum direct current proportion within standard limits of the current to be measured and nevertheless small enough so that maximum standard angle error in combination with the inductance of the transformer is not exceeded.

BRIEF EXPLANATION OF THE DRAWING

The drawing shows an example of an embodiment of the invention in simplified, diagrammatic form.

The sole FIGURE shows a measuring circuit arrangement for electronic electricity meters for direct connection according to the invention.

DETAILED DESCRIPTION

The sole FIGURE shows a measuring circuit arrangement 1 for electricity meters for direct connection which, for each phase of a three-phase supply, has an input 3 for the voltage measurement and an input 4 for the current measurement of a measuring chip 2. This measuring chip 2 is provided with a correction device 6 for the purpose of phase compensation between voltage values and current values. Upstream from the input 3 for voltage measurement is a voltage divider comprising a first resistance $R_1$ and a second resistance $R_2$, which lowers the voltage for measurement to a voltage level suitable for the measuring chip 2 connected in series downstream from it.

Immediately before the input 4 for the current measurement a voltage transformer 5 is installed which also has a measuring shunt RSH installed in series upstream from it. The current to be measured that flows through the measuring shunt $R_{SH}$ induces in this measuring shunt $R_{SH}$ a drop in voltage proportional to the value of the current, which by means of the voltage transformer 5 is transformed to a voltage level suitable for the input 4 for current measurement. By means of a turns ratio $N_1/N_2$ between the number of turns in the primary winding $N_1$ and the number of turns in the secondary winding $N_2$, voltage level matching for the input 4 for current measurement on the measuring chip 2 is achieved. In addition, the necessary galvanic isolation is available and ready from the voltage transformer 5.

As regards the smallest possible angle error of the voltage transformer 5, the value of the ohmic resistance R (not shown) of the voltage transformer 5 on the primary side—i.e. to the measuring shunt $R_{SH}$—must be chosen as small as possible. This will result from the following line of reasoning:

This ohmic resistance R behaves proportionally to the square of the number of turns of the primary winding $N_1$ of the voltage transformer 5:

$$R = A_R * N_1^2, \quad (1)$$

where $A_R$ is the core-specific primary winding resistance correction value.

The same applies to the inductance L (also not shown) of the voltage transformer 5, though taking into account the core-specific main inductance correction value $A_L$:

$$L = A_L * N_1^2. \quad (2)$$

For the angle error δ it is known that:

$$\tan\delta = \frac{R}{\omega L} = \frac{A_R N_1^2}{\omega A_L N_1^2} = \frac{A_R}{\omega A_L}. \quad (3)$$

It follows that the angle error δ—which in order to conform to standard must be as small as possible—is independent of the number of turns in the winding of the voltage transformer 5, so that only the ohmic resistance R in accordance with (1) needs to be chosen to be as small as possible in relation to the impedance ωL, with L in accordance with (2).

But a further requirement for the ohmic resistance R of the voltage transformer 5 is that it must be at least large enough so that the proportion of direct current in accordance with the standard that flows through it does not apply an inadmissible magnetic bias to the voltage transformer, since the standard specifies that the measuring circuit arrangement 1—comprising the voltage transformer 5 upstream of the input 4 for current measurement—must be capable of tolerating a proportion $\leq I_{max}/\pi$ of direct current in the mixed current impingement on this measuring circuit arrangement 1 and at the same time be capable of measuring the energy of the alternating current portion in the electricity meter for direct connection.

For this reason, it is important to give a special layout to the measuring circuit arrangement 1 with respect exclusively to its capacity to tolerate direct current, and without taking into consideration the capacity of the measuring circuit arrangement 1 to measure alternating current.

With regard to capacity to tolerate direct current, it is possible, for the voltage drop at the voltage transformer 5, to write the following:

$$R_{SH} I_{RSH} = R I_R, \quad (4)$$

where $I_{RSH}$ is the proportion of direct current flowing through $R_{SH}$ and $I_R$ is the proportion of direct current flowing through R of the voltage transformer 5. Equation (4) is equivalent to:

$$I_R = I_{RSH} \frac{R_{SH}}{R}. \quad (5)$$

For the magnetic field $H_0$ on the basis of the direct current impingement in the voltage transformer 5, we can write:

$$H_0 = I_R \frac{N_1}{l_m}, \quad (6)$$

where $l_M$ stands for the mean effective length of the magnetic circuit; thence, with (5), it follows that:

$$H_0 = I_{RSH} \frac{R_{SH}}{R} \frac{N_1}{l_m}, \text{ which is equivalent to} \quad (7)$$

$$R = \frac{I_{RSH} R_{SH}}{H_0} \frac{N_1}{l_m}. \quad (8)$$

This leads to the inescapable conclusion that for a maximum permissible field strength $H_0 = H_{0max}$ for the chosen core material and a maximum voltage drop $I_{RSH} R_{SH}$ at the measuring shunt, the ohmic resistance R of the voltage transformer is directly proportional to the number of turns $N_1$. Therefore this ohmic resistance R must be greater than or equal to a minimum value $R_{min}$, which is given by:

$$R_{mind} \geq \frac{I_{RSH} R_{SH}}{H_{0max} l_m} N_1. \quad (9)$$

Using the first condition for the ohmic resistance R of the voltage divider 5 that results from the equations (1) to (3), that is to say choosing R as small as possible as a function of the square of the number of turns N1, and the second condition from equation (9), determining a minimum value for R depending on the number of turns N1, a preferable resistance value for R can be obtained. For this preferable resistance value R, in the first place the voltage transformer 5 will not become saturated when a standard direct current impinges upon an electricity meter, and in the second place the angle error in transformation can be kept to a minimum.

In order to obtain direct current tolerance according to the standard of up to $I_{max}/\pi$ in the measuring circuit arrangement 1, taking account of the above equations, the core material of the voltage transformer 5 is made from a material of high permeability, such as ferrite, permalloy or a nanocrystalline material, for example. These high permeability materials display a high main inductance correction value $A_L$ and well defined $H_0$ values, making them exceptionally suitable for use in electricity meters which are direct current tolerant in conformity with their IEC standards.

The measuring chip 2 is equipped—as already remarked—with a correction device 6 for phase compensation, by means of which a phase shift between the input 3 for the voltage measurement and the input 4 for the current measurement can be provided. As this phase shift is small, because of the layout described above for the voltage transformer in a measuring circuit arrangement 1 in accordance with the invention, it is possible to take into consideration the fact that phase compensation by means of the correction device 6 is frequency-dependent. A simple embodiment of the correction device 6 provides a programmable delay which is effected by means of software. Naturally, it is also possible to conceive of phase compensation by means of components in the correction device 6, such compensation by means of components being frequency-dependent. By the requirement of the standard in force, the phase shift between current and voltage may not exceed an angle of 0.3°.

The three-phase layout of a measuring circuit arrangement shown in the Figure. can of course also be constructed for a single phase only, without the need for any additional invention.

KEY TO REFERENCE NUMBERS

1 Measuring circuit arrangement
2 Measuring chip
3 Input for voltage measurement
4 Input for current measurement
5 Voltage transformer
6 Correction device
$R_1$ Resistance
$R_2$ Resistance
C Condenser
$R_{SH}$ Measuring shunt

The invention claimed is:

1. Measuring circuit arrangement for electricity meters for direct connection with a first input for voltage measurement and a second input for current measurement, a voltage transformer being positioned upstream of the second input for current measurement between a measuring shunt and this second input for the purpose of galvanic isolation, characterized in that the voltage transformer to the measuring shunt has an ohmic resistance which on the one hand sufficiently limits any standard impingement of direct current on the voltage transformer and that on the other hand this ohmic resistance is small enough so that together with the inductance of the voltage transformer provides no more than standard angle error.

2. Measuring circuit arrangement according to claim 1, characterized in that the voltage transformer takes the form of a toroidal core transformer.

3. Measuring circuit arrangement according to claim 1, characterized in that the voltage transformer possesses a highly permeable core made of ferrite, permalloy or a nanocrystalline material.

4. Measuring circuit arrangement according to claim 1, characterized in that a measuring chip is connected to the first and second inputs, this measuring chip being equipped with a programmable correction device to correct the phase compensation between voltage measurement and current measurement.

5. Measuring circuit arrangement according to claim 4, characterized in that voltage level matching for the second input of the measuring chip can be adjusted by means of a winding turns ratio of the voltage transformer.

6. Measuring circuit arrangement according to claim 2, characterized in that the voltage transformer possesses a highly permeable core made of ferrite, permalloy or a nanocrystalline material.

7. Measuring circuit arrangement according to claim 2, characterized in that a measuring chip is connected to the first and second inputs, this measuring chip being equipped with a programmable correction device to correct the phase compensation between voltage measurement and current measurement.

8. Measuring circuit arrangement according to claim 3, characterized in that a measuring chip is connected to the first and second inputs, this measuring chip being equipped with a programmable correction device to correct the phase compensation between voltage measurement and current measurement.

9. A measuring circuit arrangement for electricity meters having a first input for voltage measurement and a second input for current measurement, the measuring circuit arrangement comprising:

a voltage divider upstream of the first input;

a voltage transformer positioned upstream of the second input, the voltage transformer including a primary winding and a secondary winding; and a measuring shunt connected upstream of the voltage transformer across the primary winding;

wherein the ohmic resistance of the primary winding substantially limits standard impingement of direct current on the voltage transformer.

10. The measuring circuit of claim 9 wherein the ohmic resistance of the primary winding is small enough so that the resistance of the primary winding together with the inductance of the primary winding results in no more than standard angle error.

11. The measuring circuit arrangement of claim 9 wherein the voltage transformer comprises a highly permeable core made of ferrite, permalloy or a nanocrystalline material.

* * * * *